Aug. 15, 1967 W. E. GRANT 3,335,489

INTERCONNECTING CIRCUITS WITH A GALLIUM AND INDIUM EUTECTIC

Filed Sept. 24, 1962

INVENTOR.
WILLIAM E. GRANT

BY A. M. Fernandez

ATTORNEY

United States Patent Office 3,335,489
Patented Aug. 15, 1967

3,335,489
INTERCONNECTING CIRCUITS WITH A GALLIUM AND INDIUM EUTECTIC

William E. Grant, Placentia, Calif., assignor to North American Aviation, Inc.
Filed Sept. 24, 1962, Ser. No. 225,804
1 Claim. (Cl. 29—628)

This invention pertains to a method of making interconnections in multilayer printed wiring boards having two or more printed wiring patterns interconnected through holes in electrically insulating material.

Since the advent of semi-conductor devices, a continued effort has been made to miniaturize circuits and, since the development of solid-state circuit devices comprising semi-conductor wafers on which functional electronic circuits are etched, an effort has been made to miniaturize complete systems through miniaturized printed wiring boards for interconnecting solid-state circuit devices. The latter may be referred to as microminiaturization to distinguish from the earlier effort of miniaturizing circuits through the use of miniature tubes, transistors, and the like, connected by so-called printed circuit boards to form functional circuits that are interconnected through wiring in back of a panel or rack on which the boards are mounted to form a system. In a microminiaturized system employing solid-state circuits, or similar devices, printed wiring boards are employed to interconnect solid-state circuit devices that may be mounted on the boards which may in turn be interconnected through back panel wiring if necessary to form a larger system.

Maximum compactness of printed wiring boards is desired for either miniaturization or microminiaturization. To achieve compactness, both sides of a board supporting printed wiring patterns are often utilized, particularly where cross-over connections are required, with interconnections through an insulating layer as desired. For microminiaturization it is often desirable to fabricate printed wiring boards having three or more superimposed wiring patterns separated by substrates comprising sheets of electrically insulating material through which the desired electrical interconnections are made.

The provision of compact miniature interconnections through the insulating material of a double-sided printed wiring board has been a problem. A commonly used technique has been to mechanically place a lead, pin, eyelet, rivet or staple through the board and, in order to assure electrical continuity, to solder both ends thereof to conductors of respective printed wiring patterns. Another technique has been to plate through connecting holes. The mechanical technique is reliable but not totally satisfactory because of the limit imposed on the minimum distance between centers of such connectors and on the minimum distance between superimposed multilayer boards. The plating technique overcomes the limitations of the mechanical technique and is reliable, but does present some problems in fabricating multilayer printed wiring boards. For example, a plated interconnection does not itself provide a firm base for thermo-compression bonding of components or solid-state circuit devices to the outside layers.

The object of this invention is to provide a method for making improved interconnections in multilayer printed wiring boards.

According to the invention, a hole or perforation drilled or etched through a printed wiring board at a point where an interconnection is desired is filled with a metal alloy while in a liquid phase (referred to hereinafter as a liquid solution) at room temperature, such as an admixture of mercury, gallium or indium or a eutectic of at least one of them with one or more other metals such as copper, silver or gold or other electrically conductive metals in such proportions that all interalloying elements form a transitional liquid phase with no change in temperature for a period sufficient to work the mixture into the interconnecting holes, whereupon it will solidify and assume a fusion temperature several hundred degrees higher than the original solution temperature. This is in contrast with solder mixtures which consistently melt and solidify at their inherently specific temperatures. The present conductive alloy, which remains liquid for a relatively short time at room temperature, once solidified will remain a solid solution over a range of temperatures from −50° to 500° C. Thus, when first mixed at room temperature, between 24° to 30° C., the conductive alloy will be liquid for a short time and then will solidify at this temperature. The melting point of the solid alloy will exceed 500° C. before it again liquifies. Any mixture of metals may be employed if they form a liquid solution at a low temperature for a sufficiently long period to allow it to be worked into the hole before solidifying, but alloys formed using mercury, gallium or indium, particularly alloys of gallium and indium, are preferred because they remain solid at much higher temperatures than the low temperature at which solidification takes place. Although particular examples of suitable alloys are described, it should be understood that many other alloys may be selected by reference to phase diagrams such as those presented by Max Hansen in Constitution of Binary Alloys, Metallurgy and Metallurgical Engineering Series, McGraw-Hill Book Co. (1958). For the purpose of describing the present invention, an alloy is defined as one or more low melting point metals, or a eutectic of a low melting point metal, mixed with one or more other metals to form a liquid solution that, due to the low melting point metal or eutectic in the mixture, can be worked for an appreciable interval of time before solidifying at room temperature or at some relatively low processing temperature.

The manner and process of making and using the present invention is described with reference to the drawings in which.

Figure 1:
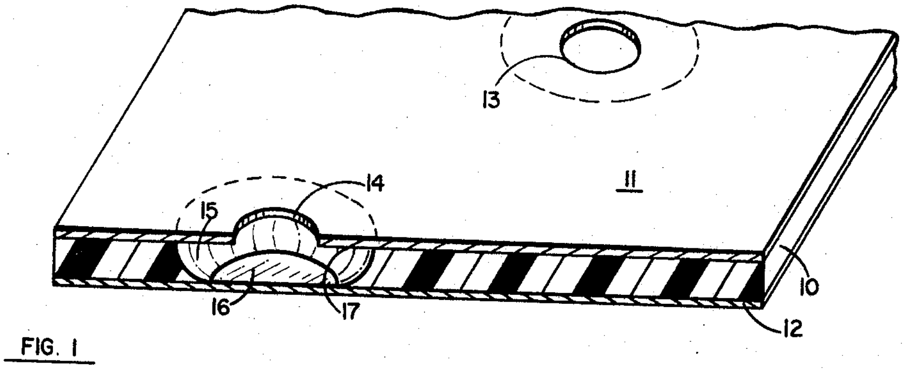
FIG. 1 illustrates a blank board having connecting holes through its insulating material.

In order to utilize the present invention to best advantage, the interconnecting holes are made in a blank board before the wiring patterns are etched, as illustrated by the drilled double-clad board of FIG. 1. A supporting base or substrate 10 made of electrically insulating material, such as an epoxy resin impregnated glass cloth, is laminated with two thin sheets of copper 11 and 12. Holes 13 and 14 are etched through the copper sheet 11 at points where interconnections are desired using a ferric chloride solution, or some suitable etching solution such as ammonium persulphate, which will not etch the resin impregnated glass cloth of the substrate 10.

After the holes 13 and 14 have been etched through the copper sheet 11, holes are etched through the substrate 10, such as a hole 15, using the etched copper sheet 11 as a mask, such as with a solution of hydrofluoric and sulfuric acids which will not dissolve the copper sheets 11 and 12. The etching time for the substrate 10 is dependent upon its thickness, but can be reduced and controlled by proper agitation of the solution. The hole 15 is etched through the substrate 10 to the inner surface 16 of the copper sheet 12. The etching process is allowed to continue until a sufficient surface area 16 of the copper sheet 12 is exposed for the purpose of making an electrical connection thereto.

It should be noted that as the etching process of the insulating substrate 10 proceeds, the inner surface or underside of the copper sheet 11 is exposed due to the etching of the substrate 10 at a rather uniform rate in all directions from the center of the hole 14. The resulting undercut 17 around the hole 14 could be removed by a second etching process, but that is not essential for the practice of the present invention even though it may be desirable to enlarge the hole 14 in order to facilitate better filling with an alloy in accordance with the present invention.

The alloy to be worked into the connecting holes is spread, rolled, or otherwise applied, to the copper sheet 11 while in the liquid phase until the holes, such as the concentric holes 14 and 15, are filled from the upper surface 16 of the lower sheet of copper 12 to the upper surface of the upper copper sheet 11. The alloy is preferably compressed or maintained under vacuum or a combination of these, while filling the holes to obtain better compaction and greater alloy density within the holes. In addition, the alloy fill may be allowed to solidify at an elevated temperature and pressure, such as at 350° F. under a pressure of 150 p.s.i., during which time the alloy fill may exude any excess liquid metal for proper mixing of the liquid metal with the solid metal to form a solution which will pass from a liquid phase to a solid phase at that temperature.

Figure 2:
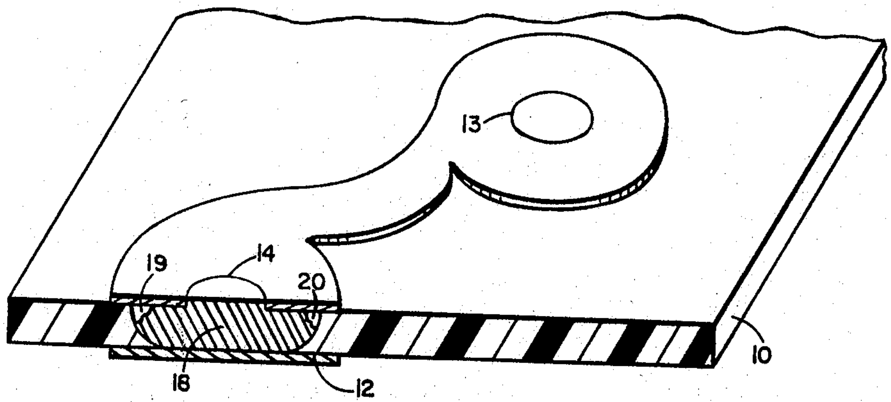
FIG. 2 illustrates the blank board of FIG. 1 after the connecting holes have been filled with an alloy in accordance with the present invention and a desired wiring pattern has been etched on the copper sheets.

After the alloy fill in the connecting holes has been allowed to completely solidify, the desired wiring patterns may be etched into the copper sheets 11 and 12 with a solution of ferric chloride. FIG. 2 illustrates the board of FIG. 1 having the connecting holes 13 and 14 filled and the desired wiring patterns etched into the copper sheets 11 and 12. The alloy fill 18 in the hole 14 is shown in cross section in order to point out that due to the undercut in the insulation sheet 10 around the hole 14, pockets of entrapped air, such as pockets 19 and 20, may be formed. Those pockets do not materially detract from the electrical continuity desired between the conductive sheets 11 and 12 through the alloy fill 18 in the hole 14, but to obtain more complete filling, the board may be placed in a vacuum chamber before the alloy fill 18 is allowed to solidify and the desired wiring pattern etched, thereby drawing out entrapped air and allowing the alloy to more completely fill the hole.

The following table of some alloys which may be employed to practice the invention is to be considered as illustrative of several embodiments of the invention and not as an exhaustive list of all the embodiments possible. Other alloys may be more suitable for certain applications or methods of fabrication. Accordingly, although a suitable alloy may be selected from the table for most printed wiring board applications, other alloys may be selected from the art, particularly binary alloys, as by reference to the phase diagrams in Constitution of Binary Alloys referred to hereinbefore.

PERCENT OF CONSTITUENT METALS

| | Ga | Au | Cu | Hg | Ag | Sn | In |
|---|---|---|---|---|---|---|---|
| 1 | 18 | 82 | ------- | ------- | ------- | ------- | ------- |
| 2 | 34 | 66 | ------- | ------- | ------- | ------- | ------- |
| 3 | 35 | 65 | ------- | ------- | ------- | ------- | ------- |
| 4 | 36 | 64 | ------- | ------- | ------- | ------- | ------- |
| 5 | 41 | 59 | ------- | ------- | ------- | ------- | ------- |
| 6 | 34 | 33 | 33 | ------- | ------- | ------- | ------- |
| 7 | 30 | 49 | ------- | ------- | 21 | ------- | ------- |
| 8 | 32 | ------- | 44 | ------- | ------- | 24 | ------- |
| 9 | 32 | ------- | 50 | ------- | ------- | 18 | ------- |
| 10 | 36 | ------- | 60 | ------- | ------- | 4 | ------- |
| 11 | 45 | ------- | 50 | ------- | ------- | 5 | ------- |
| 12 | 68 | ------- | 25 | ------- | ------- | 7 | ------- |
| 13 | 34 | ------- | 66 | ------- | ------- | ------- | ------- |
| 14 | ------- | ------- | ------- | 70 | 30 | ------- | ------- |
| 15 | ------- | ------- | 30 | 70 | ------- | ------- | ------- |
| 16 | ------- | ------- | ------- | ------- | 30 | ------- | 70 |
| 17 | 26.6 | 65 | ------- | ------- | ------- | ------- | 8.4 |
| 18 | 32.2 | 65 | ------- | ------- | ------- | 2.8 | ------- |
| 19 | 32.2 | ------- | 65 | ------- | ------- | 2.8 | ------- |
| 20 | ------- | 60 | ------- | ------- | ------- | 40 | ------- |

The first five examples of the foregoing table represent the range of useful percentages of the liquid metal gallium alloyed with gold. If the gallium is reduced to less than 18%, the mixture is too dry and incomplete mixing to form an alloy of all of the gold results. If the gallium is increased to more than 41%, the mixture is too wet and a solid solution may not result. Accordingly the more limited intermediate range of 34 to 36% gallium is preferred for more uniform results. Liquid solutions in that range pass into the solid phase at room temperature in about eight hours. After the solidification process has been completed, the solid solution will remain sufficiently hard at temperatures exceeding 500° C. By the term sufficiently hard it is meant that the alloy will have a predetermined resistance to plastic deformation usually by indentation.

A similar range of working percentages of gallium and any other metal, such as silver or copper, may be developed by referring to the phase diagrams of the particular alloy. Similarly, alloys of other low melting point metals, such as mercury and indium, may be considered and a preferred range for uniform results defined by reference to phase diagrams.

The characteristics of an alloy may be altered by the addition of one or more metals. For instance, in the Example 6 of the foregoing table, copper has been substituted for half of the gold in the second example. The resulting alloy requires the same period of time to solidify (about eight hours) but will remain sufficiently hard at higher temperatures (as high as 650° C.) than the second example. By the substitution of silver in the Example 7, an alloy results with a shorter solidifying period and a lower useful range of temperatures. More specifically, the Example 7 will solidify in about two hours and remains sufficiently hard to a temperature of about 425° C.

The next five Examples 8 to 12 include gallium, copper and tin in different proportions. The Examples 8 and 9 require a long period to solidify (about 24 hours), but remain sufficiently hard at temperatures as high as 650° and 700° C., respectively. The next two Examples 10 and 11 contain less tin and completely solidify in a shorter period of time (about 4 to 6 hours) while the Example 12 requires a longer period of time (about 24 to 48 hours) due to the larger proportion of gallium.

In general, a longer solidifying period provides a longer period to work the alloy into the holes since, as a rule, the working period is about 5 to 15% of the solidifying period. Accordingly, a longer solidifying period is preferred as long as the resulting alloy is sufficiently hard. For instance, the Example 12 provides a long working period, but the resulting alloy was found to be a soft metal that may not be satisfactory in some applications of the invention.

The next Example 13 is an alloy of gallium and copper which is similar to the Example 2 but remains sufficiently hard at higher temperatures up to about 900° C. Comparing it to the Examples 8 to 12 containing tin, it may be seen that the presence of tin provides a longer solidifying time but produces a hard alloy only if the proportion of gallium is held low. Accordingly, a eutectic of gallium and tin with 64 to 66% copper is preferable, particularly since the addition of tin reduces the useful range of the alloy.

The following Examples 14 and 15 are alloys of mercury. The Example 14 is an alloy of mercury and silver sometimes employed in different proportions as a dental amalgam. It solidifies in about three hours and melts at 276° C. The Example 15, an alloy of mercury and copper, is similar and also satisfactory for the practice of the invention since it forms a solid solution at room temperature (22.2° C.) and melts at 96° C.

The next Example 16, an alloy of indium and silver, is similar to the Example 14, except that it has a higher formation temperature since pure indium melts at 156.4° C. and does not melt below 400° C. Other binary or ternary alloys of indium may be advantageously employed, particularly when the printed wiring board is apt to be used in environments at higher temperatures. For instance, a powdered mixture of equal parts of gold and indium may be used to fill the holes after which the printed wiring board may be placed in an oven until the mixture reaches 156.4° C., the melting temperature of indium, at which temperature a liquid solution of indium and gold is formed. That solution forms a solid solution at that temperature and remains sufficiently hard at higher temperatures up to about 500° C. Like all of the alloys under consideration, the indium-gold alloy is stable in the solid solution at all temperatures below room temperature.

The next Example 17 is the preferred alloy comprising a eutectic of gallium and indium mixed with 65% gold. The percentage of gold may be varied by as much as 5% with results as satisfactory as with Examples 2, 3 and 4.

A eutectic is a solution of two or more metals having its components in such proportions that the melting point of the solution is the lowest possible with those components. As such, the proportions for any eutectic can be ascertained by the standard techniques of stoichiometry, but for the practice of the present invention it is not necessary that the proportions ascertained be followed in mixing the eutectic to the same degree of accuracy as the degree of accuracy to which the proportions are determined since the percentage of the eutectic itself in the mixture of the alloy is not critical. The advantage of using a eutectic is that it has a lower melting temperature than its component metals. For instance, the eutectic of gallium and indium has a melting point of 16° C. whereas gallium alone has a melting point of 29.75° C.

Example 18 is another alloy formed from a eutectic, namely a eutectic of gallium and tin. The eutectic is mixed with gold in the same proportion as in the Examples 3 and 17. The eutectic has a melting point of 20° C. so that it is easier to form an alloy with other metals such as gold in the Example 18 or copper in the Example 19.

If even higher temperatures of formation can be tolerated than that of Example 16 which forms an alloy at temperatures higher than the melting temperature 156.4° C. of indium, other alloys may be employed such as binary alloys of tin. The last Example 20 is an alloy of that type consisting of 40% tin and 60% gold. At 232° C. the tin melts and alloys with the gold to provide a liquid or plastic solution for a period of time before the solid solution is formed. The alloy thus formed remains hard to a temperature of about 500° C.

Since, as noted hereinbefore, alloys of gallium, indium or mercury tend to expand as they harden, if such an alloy is used, the evacuated pockets in the perforations are readily filled by the expanding alloy. Further expansion after the evacuated pockets have been filled will not materially affect the board because the alloys of gallium or indium packed into the holes tend to compress rather than build up pressure due to expansion, and what pressure is produced is greatly relieved through the hole 14.

After the alloy has been allowed to solidify, the excess alloy on the surface of the copper sheet 11 may be removed by some suitable method, as by abrading. Thereafter, the entire surface of the board may be copper plated, if desired, in order to provide a protective copper film over the alloy filling of the holes 13 and 14 before the desired wiring patterns are etched, but that is not necessary as the alloy will withstand wear and further processing of the board during the fabrication of additional layers.

For greater assurance of proper electrical continuity between the circuits etched in the copper sheets 11 and 12, the etched holes 13 and 14 in the copper sheet 11 may be enlarged after the connecting holes have been etched through the insulating material of the substrate 10, as noted hereinbefore, in order to facilitate complete filling of the holes. For even greater assurance of continuity, the holes may be copper plated before filling, as by first electroless plating and then elector plating. The resulting copper plating through the hole may itself provide the desired continuity between the sheets 11 and 12 as in the prior art, but reliance is placed on the alloy fill in accordance with the present invention with the advantage that a firm interconnection is provided for bonding component or solid-state circuit devices.

It should be noted that the interconnecting holes may be made in some other manner and in some other shape, as by drilling or punching instead of etching, but the etching method is preferred because a large number of holes may be etched through a board simultaneously and, since the etching processes may be controlled, the holes may be placed as close together as necessary, limited only by the process employed for coating the exposed surfaces of the copper sheets 11 and 12 with a film which will resist the copper etching solution and by any undercut produced by the process of etching the insulating material 10. A mechanical drill or punch, on the other hand, has the disadvantage of being capable of punching only one hole at a time on centers only as close as the mechanical drill fixtures and control means will allow.

It should be further noted that although the method for making the connecting holes has been described as a one-sided process of etching from one side to the inner surface of the copper sheet on the other side of the substrate 10, a two-sided process may be employed by simply etching holes through both of the copper sheets 11 and 12 simultaneously and etching the insulating material of the substrate 10 from both sides. If a two-sided etching proces is used, a backing sheet of some suitable material, preferably one to which the alloy fill will not adhere, should be provided while working the alloy into the holes in order to insured complete filling. The expansion of the alloy as it solidifies assures proper electrical contact with the copper sheets 11 and 12.

Figure 3:
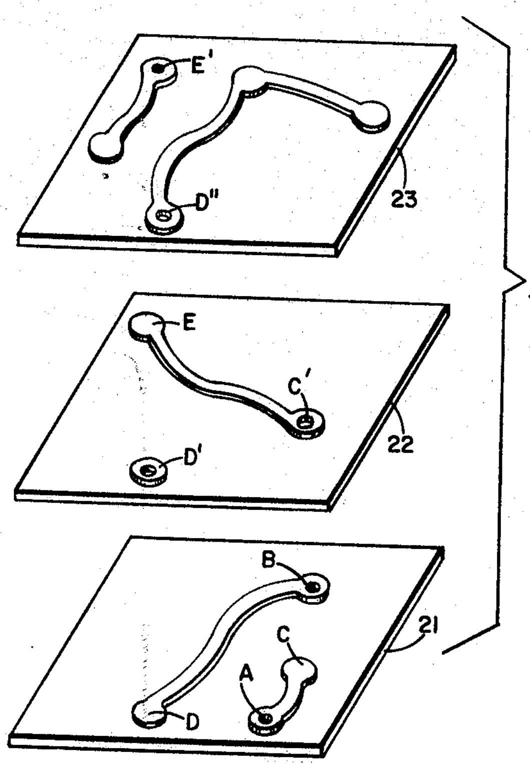
FIG. 3 illustrates the manner in which the present invention may be adapted to a method of fabricating multilayered printed wiring boards.

The manner in which the electrical connectors provided in accordance with the present invention may be utilized advantageously to fabricate multilayered circuit boards is illustrated in FIG. 3 by showing an exploded view of three circuit layers etched on substrates 21, 22 and 23. The first circuit layer is fabricated on the substrate 21 in a manner similar to that described with reference to FIGS. 1 and 2, with the exception that the bottom sheet of copper (not shown) laminated to the substrate 21 is not etched until all of the inner wiring layers have been fabricated, in order to protect or mask the insulating material of the substrate 21 during substrate etching processes. Interconnections A and B which pass through the substrate 21 are fabricated in accordance with the method of the present invention before the next printed wiring layer on the substrate 22 is laminated to the first printed wiring layer on the substrate 21.

The next printed wiring layer may be fabricated by laminating to the substrate 21 a sheet of insulating material for the substrate 22 with a copper sheet laminated to it on its upper surface and etching holes C′ and D′ through the substrate 22 to pads C and D on the substrate 21. The holes C′ and D′ are then filled with an alloy in the manner described with reference to FIG. 2 before etching the wiring pattern shown on the substrate 22 which includes a pad E to be connected to a third printed wiring layer etched on the substrate 23.

The third layer may be fabricated in a similar manner, etching the holes D″ and E′ after the substrate 23 has been laminated to the substrate 22, and filling the holes D″ and E′ with alloy to provide interconnections with the filled hole D′ and the conductive pad E on the substrate 22, before etching the third wiring pattern. If the third wiring pattern is the last layer to be fabricated, the desired wiring pattern on the bottom side of the substrate 21 may be etched at the same time. A more detailed description of this overall method of fabricating multilayer boards is described in a copending application filed concurrently herewith by Joseph M. Shaheen and Henry F. Jones, and assigned to the assignee of this invention.

A multilayered board fabricated in the manner just described utilizing the electrical interconnections of the present invention will occupy only that space which the superimposed layers of the laminated boards require and desired interconnections are readily provided in a reliable manner through either one layer, such as the interconnection E′ to the conductive pad E through the substrate 23, or a number of layers, such as the interconnections D′ and D″ to the conductive pad D on the substrate 21. It is emphasized, however, that the present invention is not in the method of producing the interconnecting holes nor in the overall method of fabricating multilayered printed wiring boards, but in the method of producing an electrical interconnection through an existing hole with a metal alloy and the interconnections produced thereby.

While particular examples of the invention have been described, it will be understood that the invention is not limited thereto since many modifications may be made in the examples with respect to the materials, proportions, temperature, pressure and time in keeping with the concept of the invention in its broadest aspect since they are not critical. Accordingly the terms of the appended claim are not to be limited to the particular examples, but to the true spirit and scope of the invention.

What is claimed is:

A method of producing an interconnection between two electrical conductors electrically separated by a substrate of insulating material comprising the steps of etching a hole through only one of said conductors at a point where said interconnection is to be made,
etching a depression in said substrate through said hole, the depth of said depression being sufficient to expose the other one of said conductors,
preparing a eutectic of gallium and indium,
preparing an alloy in the liquid state by mixing said eutectic with gold,
applying said alloy in the liquid state to said depression until filled so that said alloy contacts said separated conductors, and
allowing said alloy to solidify under pressure at an elevated temperature to create a mechanical and electrical bond between said separated electrical conductors.

References Cited

UNITED STATES PATENTS

| | | | |
|---|---|---|---|
| 1,893,380 | 1/1933 | Uschman et al. | 29—494 XR |
| 2,864,156 | 12/1958 | Cardy | 29—155.5 |
| 2,907,925 | 10/1959 | Parsons | 29—155.5 |
| 2,909,833 | 10/1959 | Murray et al. | 29—155.5 |
| 3,040,119 | 6/1962 | Granzow | 174—68.5 |
| 3,053,929 | 9/1962 | Friedman | 174—68.5 |
| 3,077,511 | 2/1963 | Bohrer | 174—68.5 |
| 3,141,238 | 7/1964 | Harman | 29—504 XR |
| 3,217,209 | 11/1965 | Kinsella et al. | 156—3 XR |
| 3,228,093 | 1/1966 | Bratton | 29—155.5 |

FOREIGN PATENTS 1,256,632 2/1961 France.

OTHER REFERENCES

Printed Circuit Packaging, IBM Technical Disclosure Bulletin, vol. 3, No. 12, May 1961.

JOHN F. CAMPBELL, *Primary Examiner.*

JOHN P. WILDMAN, *Examiner.*

C. I. SHERMAN, R. W. CHURCH, W. B. FREDRICKS, *Assistant Examiners.*